(12) United States Patent
Dede et al.

(10) Patent No.: US 12,002,613 B2
(45) Date of Patent: Jun. 4, 2024

(54) DOUBLE-SIDED COOLING PACKAGE OF INDUCTOR

(71) Applicants: Toyota Motor Engineering & Manufacturing North America, Inc., Plano, TX (US); University of Colorado Boulder, Boulder, CO (US)

(72) Inventors: Ercan M. Dede, Ann Arbor, MI (US); Tsuyoshi Nomura, Novi, MI (US); Robert Erickson, Boulder, CO (US); Dragan Maksimovic, Boulder, CO (US); Vivek Sankaranarayanan, Boulder, CO (US); Yucheng Gao, Boulder, CO (US); Aritra Ghosh, Boulder, CO (US)

(*) Notice: Subject to any disclaimer, the term of this patent is extended or adjusted under 35 U.S.C. 154(b) by 1081 days.

(21) Appl. No.: 16/692,370

(22) Filed: Nov. 22, 2019

(65) Prior Publication Data
US 2021/0159007 A1 May 27, 2021

(51) Int. Cl.
| | |
|---|---|
| G06F 1/16 | (2006.01) |
| H01F 27/18 | (2006.01) |
| H01F 27/22 | (2006.01) |
| H01F 27/26 | (2006.01) |
| H05K 5/00 | (2006.01) |

(Continued)

(52) U.S. Cl.
CPC ............ *H01F 27/22* (2013.01); *H01F 27/18* (2013.01); *H01F 27/266* (2013.01); *H05K 7/20854* (2013.01); *H05K 7/20881* (2013.01); *H05K 7/209* (2013.01); *H05K 7/20936* (2013.01); *H05K 7/20336* (2013.01)

(58) Field of Classification Search
CPC ............... H01F 27/22; H05K 7/20854; H05K 7/20881; H05K 7/209; H05K 7/20936
See application file for complete search history.

(56) References Cited

U.S. PATENT DOCUMENTS

| | | | |
|---|---|---|---|
| 7,193,851 B2 * | 3/2007 | Yatskov | H01L 23/467 257/E23.099 |
| 7,671,455 B2 | 3/2010 | Pavier | |
| 7,932,800 B2 | 4/2011 | Lim et al. | |

(Continued)

FOREIGN PATENT DOCUMENTS

| | | |
|---|---|---|
| EP | 0465700 B1 | 2/1993 |
| JP | 2018041927 A | 3/2018 |

OTHER PUBLICATIONS

Marcus Hwai Yik Tan, et al.; Illinois Experts; 3D dimensionally reduced modeling and gradient-based optimization of microchannel cooling networks (https://experts.illinois.edu/en/publications/3d-dimensionally-reduced-modeling-and-gradient-based-optimization); Published Aug. 15, 2017.

*Primary Examiner* — Anthony M Haughton
(74) *Attorney, Agent, or Firm* — Dinsmore & Shohl LLP

(57) ABSTRACT

Embodiments of the disclosure relate to apparatuses for enhanced thermal management of a planar inductor assembly. In one embodiment, a cooling package for an inductor assembly includes a cold plate and a heat-spreading bracket mechanically coupled to the cold plate at a first end of the heat-spreading bracket. The cold plate has a slotted recess for mounting a first inductor core along a first end thereof. The heat-spreading bracket is configured to apply a clamping force to a second inductor core at a second end opposite to the first end of the heat-spreading bracket.

20 Claims, 9 Drawing Sheets

(51) Int. Cl.
 *H05K 7/00* (2006.01)
 *H05K 7/20* (2006.01)

(56) References Cited

U.S. PATENT DOCUMENTS

| | | | |
|---|---|---|---|
| 7,952,879 B1 * | 5/2011 | Vinciarelli | H05K 7/209 |
| | | | 361/708 |
| 8,064,202 B2 | 11/2011 | Yin et al. | |
| 8,860,538 B2 | 10/2014 | Andersson et al. | |
| 2004/0012983 A1 * | 1/2004 | Fearing | H05K 7/209 |
| | | | 363/16 |
| 2014/0355218 A1 * | 12/2014 | Vinciarelli | H05K 5/065 |
| | | | 361/728 |
| 2017/0047156 A1 | 2/2017 | Sakamoto et al. | |
| 2018/0174732 A1 | 6/2018 | Pal et al. | |
| 2022/0210952 A1 * | 6/2022 | Singh | H05K 7/20254 |

* cited by examiner

DOUBLE-SIDED COOLING PACKAGE OF INDUCTOR

STATEMENT OF GOVERNMENT INTEREST

The subject matter of the present disclosure was developed with government support under Department of Energy Cooperative Agreement Award Number DE-AR0000897 awarded by the Advanced Research Projects Agency of the U.S. Department of Energy. Accordingly, the government has certain rights in the subject matter of the present disclosure.

TECHNICAL FIELD

Embodiments of the disclosure generally relate to a cooling mechanism for electronics applications and, more specifically, to apparatuses for enhanced thermal management of a planar inductor assembly.

BACKGROUND

A planar inductor is an electromagnetic component used to store energy in the magnetic field when electric current is passed through its electrical coil. In a planar inductor, the coil may be a flat wound wire, or it may be a winding that is embedded in a printed circuit board (PCB).

In a planar inductor assembly, the planar inductor is typically mounted to a secondary PCB and/or cold plate for electrical connection and heat sinking purposes respectively, wherein the heat generated by the planar inductor is dissipated to the cooled PCB substrate or the cold plate primarily through the bottom surfaces of the planar inductor. However, in high power applications, a challenge arises in that the heat dissipated in the various cores forming the planar inductor may lead to excessively high temperatures (e.g. greater than 120° C.) that degrade the working properties of the core ferrite material of the planar inductor. Accordingly, it is desirable to have a cooling package for the planar inductor assembly designed to help dissipate the heat generated by the various cores such that the planar inductor can continue to work efficiently and reliably over its lifetime.

SUMMARY

Embodiments of the disclosure relate to apparatuses for enhanced thermal management of a planar inductor assembly. In one embodiment, a cooling package for an inductor assembly includes a cold plate and a heat-spreading bracket mechanically coupled to the cold plate at a first end of the heat-spreading bracket. The cold plate has a slotted recess for mounting a first inductor core along a first end thereof. The heat-spreading bracket is configured to apply a clamping force to a second inductor core at a second end opposite to the first end of the heat-spreading bracket.

In another embodiment, an inductor assembly includes a cold plate having a slotted recess and a first inductor core mounted to the cold plate through the slotted recess along a first end of the first inductor core. The inductor assembly further includes a printed circuit board (PCB) disposed over the first inductor core and having one or more apertures therethrough, wherein a second end of the first inductor core protrudes through the one or more apertures and the second end of the first inductor core is opposite to the first end of the inductor core. A second inductor core is disposed on the second end of the first inductor core. A heat-spreading bracket is mechanically coupled to the cold plate at a first end of the heat-spreading bracket and applies a clamping force to the second inductor core at a second end opposite to the first end of the heat-spreading bracket.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to apparatuses for enhanced thermal management of a planar inductor assembly and in particular, to cooling packages for inductor assemblies having an upper inductor core disposed over a lower inductor core. Such inductor assemblies are commonly used in composite converter systems found in electric vehicles. Each cooling package includes a heat-spreading bracket formed from a material of high thermal conductivity and mechanically coupled to a cold plate for mounting the lower inductor core. The cold plate absorbs and dissipates heat generated by the lower inductor core. The heat-spreading bracket absorbs and dissipates heat generated by the upper inductor core, while clamping the upper inductor core to the lower inductor core. Various embodiments of cooling packages and inductor assemblies incorporating the cooling packages are described below.

Figure 1A:
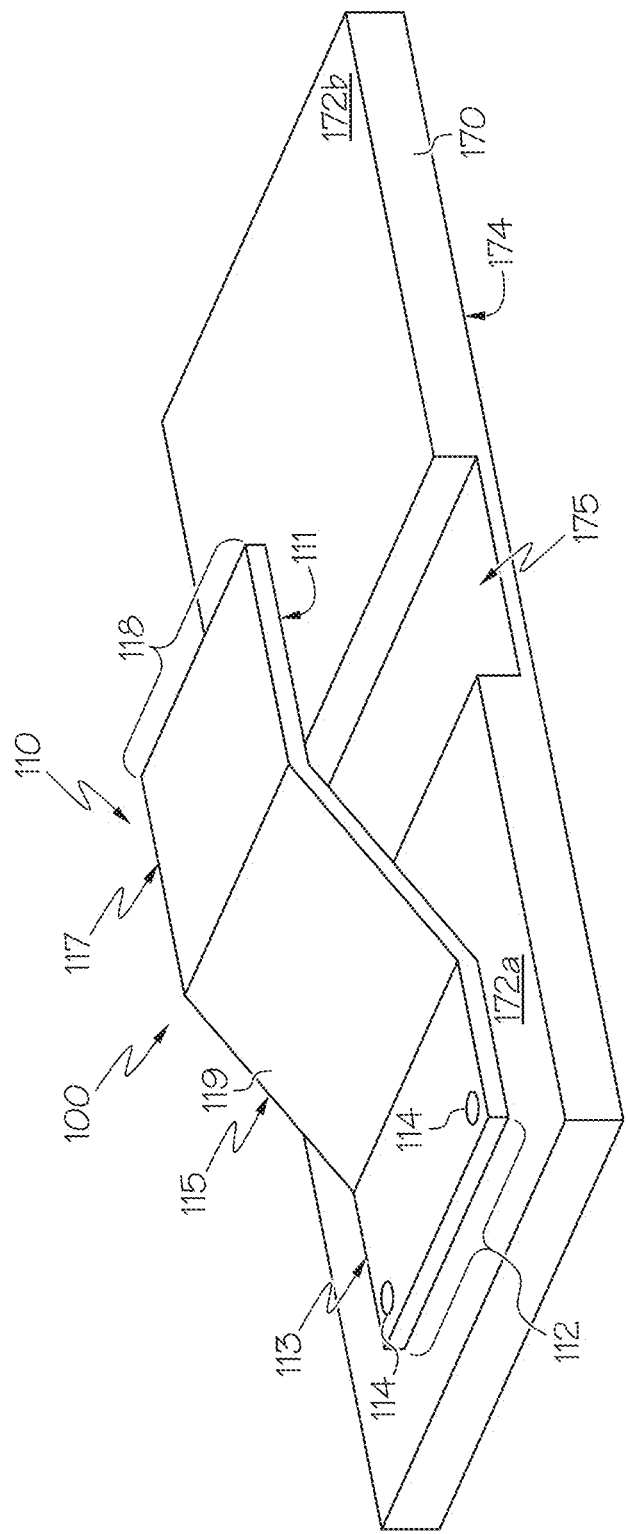
FIG. 1A depicts an isometric view of a cooling package for an inductor assembly, according to one or more embodiments shown and described herein.
Figure 1B:
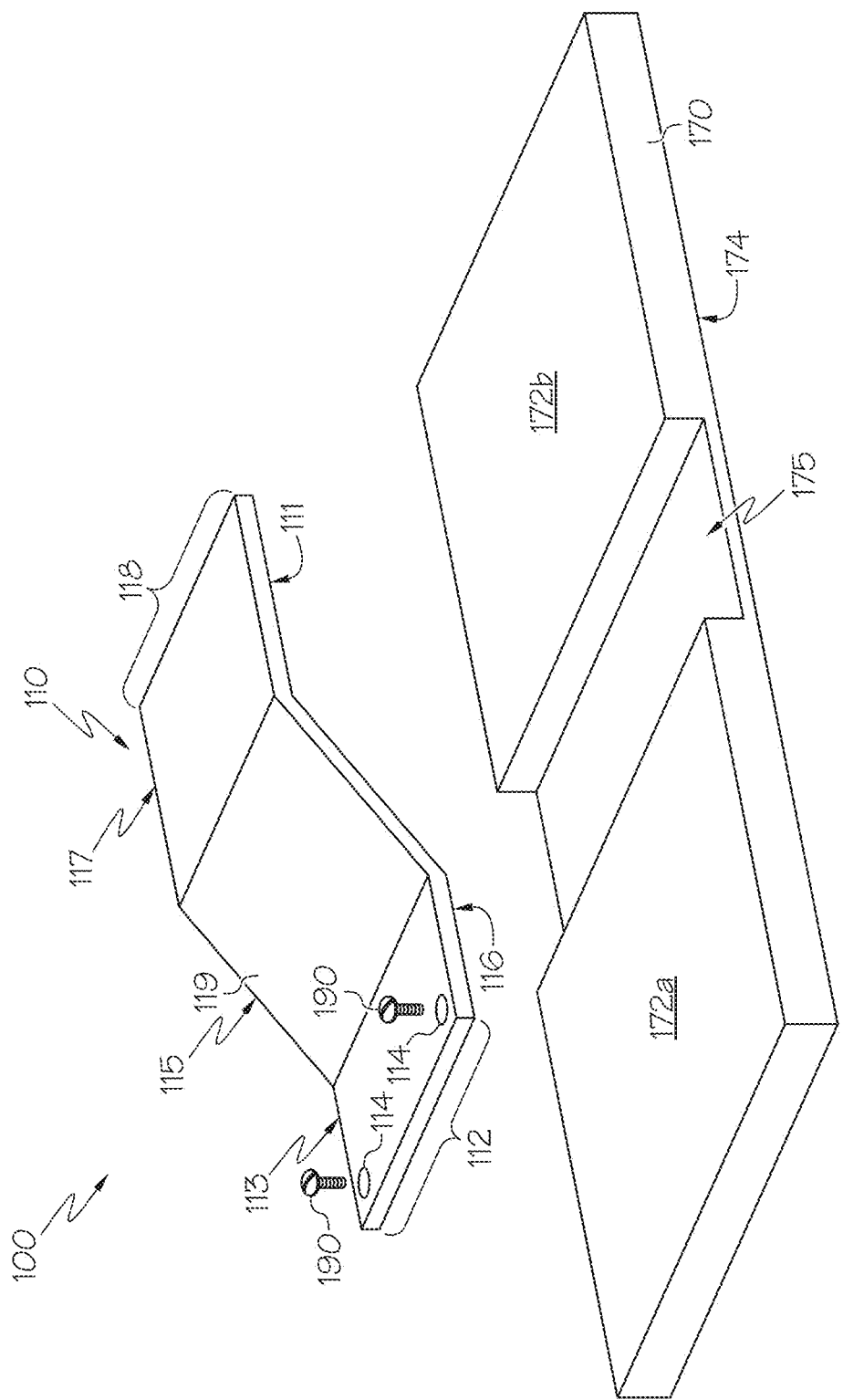
FIG. 1B depicts an exploded view of the cooling package of FIG. 1A, according to one or more embodiments shown and described herein.

FIGS. 1A and 1B depict isometric and exploded views of an example cooling package 100 for a planar inductor assembly. The cooling package 100 has a heat-spreading bracket 110 mechanically coupled to a cold plate 170 with fasteners 190. The heat-spreading bracket 110 is electrically isolated from inductor cores of the planar inductor assembly and does not conduct electromagnetic field of the planar inductor assembly. The cold plate 170 has a bottom surface 174 and top surfaces 172a, 172b on either side of a slotted recess 175. The slotted recess 175 is configured for mounting an inductor core of the planar inductor assembly. The slotted recess 175 is shaped as a rectangular notch, though in other embodiments it may be shaped differently.

Figure 6:
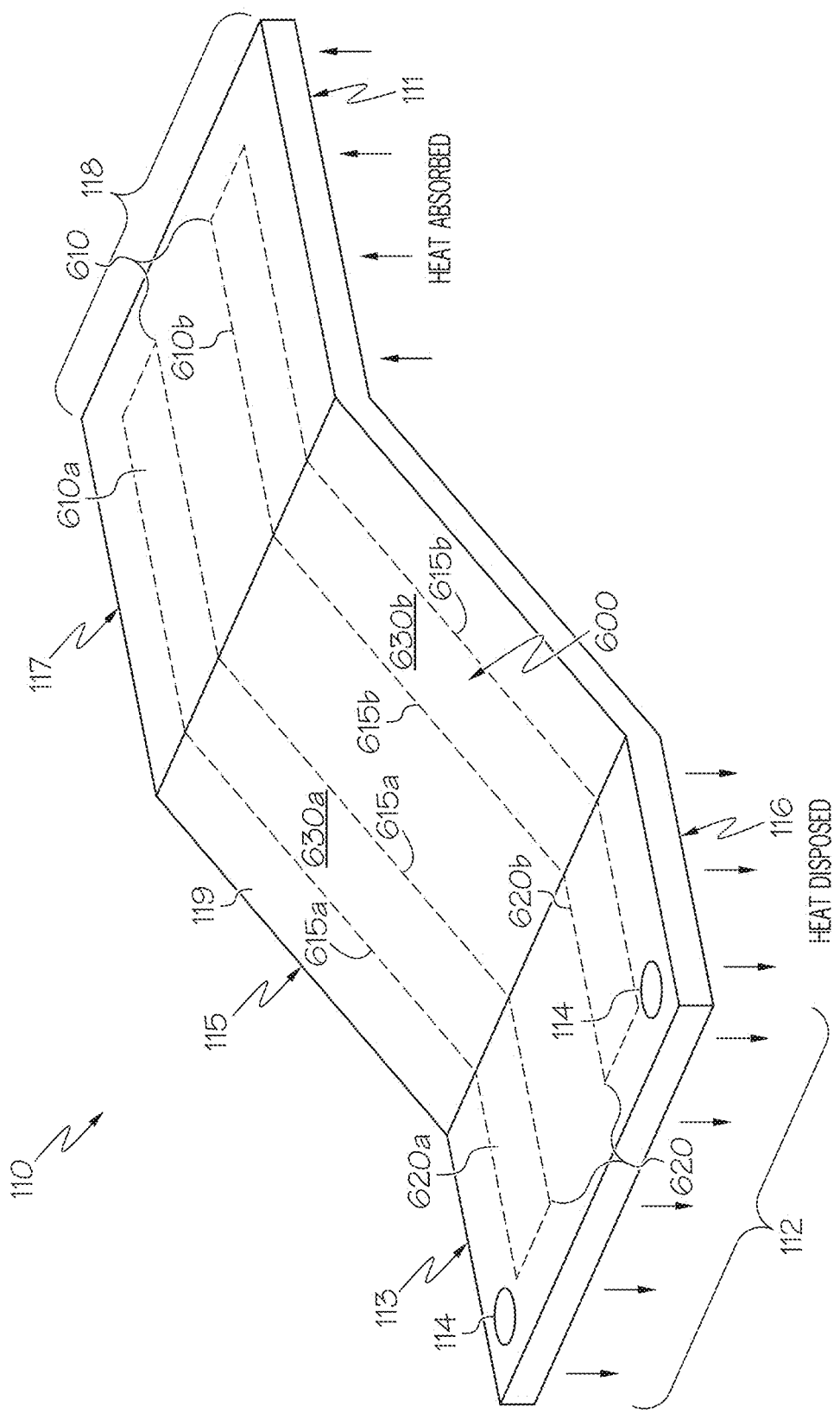
FIG. 6 depicts an isometric view of an example heat-spreading bracket with an embedded heat pipe, according to one or more embodiments shown and described herein.

The heat-spreading bracket 110 may be fabricated from a material having high thermal conductivity such as, but not limited to, graphite, a metal (for example, aluminum, copper), an alloy, or thermally-enhanced polymer composites having thermal conductivity greater than 100 W/m*K. In some embodiments, the heat-spreading bracket 110 includes a heat-spreading structure for directionally transferring heat generated by the upper inductor core towards the cold plate. In some examples, the heat-spreading bracket 110 may be made of aluminum and includes a heat-spreading structure formed from a graphite inlay housed within the aluminum for enhanced heat transfer. The effective thermal conductivity of the heat-spreading bracket 110 is then about 800-1000 W/m*K. In other examples, as shown in FIG. 6 and described in detail below, the heat-spreading bracket 110 may have a heat-spreading structure including one or more embedded heat pipes.

The heat-spreading bracket 110 includes three portions—a first portion 113, a sloping portion 115 and a second portion 117—between a first end 112 and a second end 118 opposite to the first end 112. In the illustrated embodiment shown in FIGS. 1A-1B, the first portion 113 and the second portion 117 are horizontally aligned with the cold plate 170. However, in other embodiments, the first portion 113 and the second portion 117 may be shaped differently. The first portion 113 is proximate to the first end 112 and the second portion 117 is proximate to the second end 118. The second portion 117 is positioned at a greater distance (i.e. height) with respect to the cold plate 170 than the first portion 113. The sloping portion 115 has a sloping surface 119 between the first portion 113 and the second portion 117. In the illustrated embodiment, the first portion 113 has two or more holes 114 for accommodating fasteners 190 such that the heat-spreading bracket 110 can be mechanically coupled to the cold plate 170. The first portion 113 has a bottom surface 116 that contacts the top surface 172a of the cold plate 170 when the heat-spreading bracket 110 is mechanically coupled to the cold plate 170. In some embodiments, the bottom surface 116 is coated with thermal grease, which enhances the thermal contact and hence the heat transfer between the cold plate 170 and the heat-spreading bracket 110. As referred herein, "thermal contact" means a direct or indirect connection between two surfaces that allows the exchange of heat between the two surfaces. The second portion 117 has an interface 111 through which the heat-spreading bracket 110 is configured to apply a clamping force to an inductor core. In some embodiments, the interface 111 may have a recess (not shown) or a layer of adhesive to aid in applying the clamping force to the inductor core.

Figure 2A:
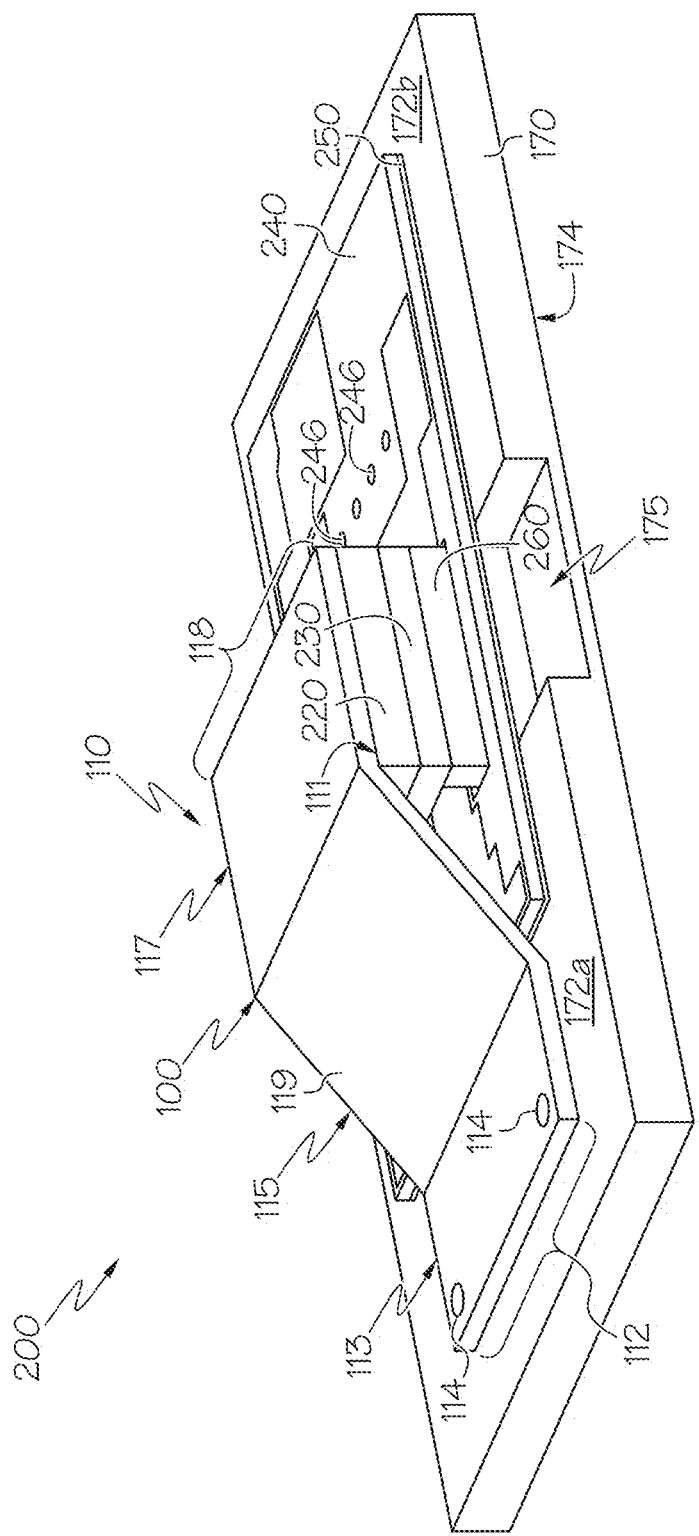
FIG. 2A depicts an isometric view of an inductor assembly with the cooling package of FIG. 1A, according to one or more embodiments shown and described herein.
Figure 2B:
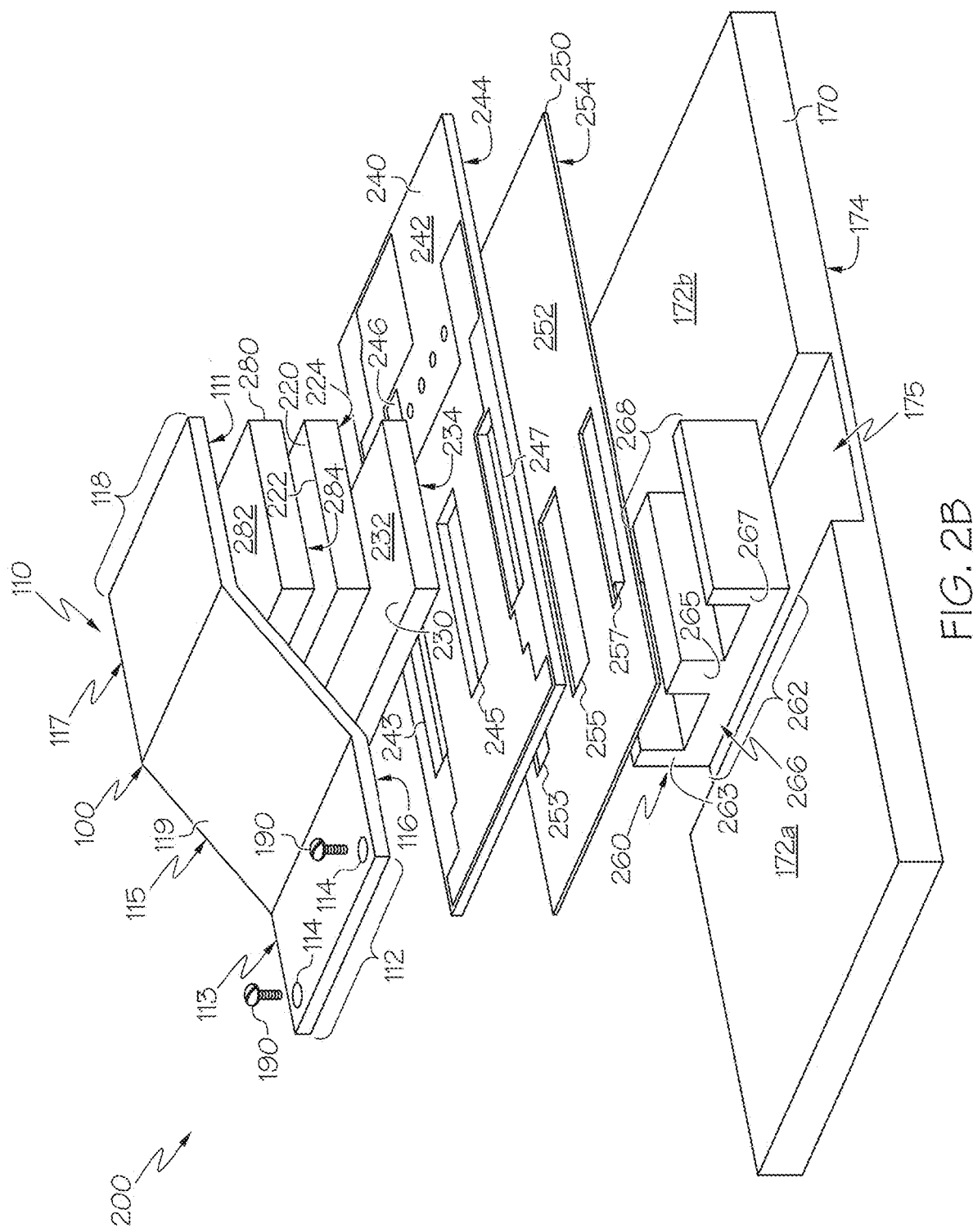
FIG. 2B depicts an exploded view of the inductor assembly of FIG. 2A, according to one or more embodiments shown and described herein.

FIGS. 2A and 2B depict isometric and exploded views of an example inductor assembly 200 with the example cooling package 100 thermally coupled thereto. The inductor assembly 200 includes a first inductor core 260, a printed circuit board (PCB) 240, and a second inductor core 220 disposed on the first inductor core 260. In the example inductor assembly 200 shown in FIGS. 2A and 2B, the first inductor core 260 is E-shaped and the second inductor core 220 is I-shaped. However, in some embodiments, both the first inductor core 260 and the second inductor core 220 may be E-shaped. The first inductor core 260 and the second inductor core 220 are made of a ferrite material such as, but not limited to, iron, an iron alloy, or a magnetic material.

The first inductor core 260 has a base 266 at a first end 262, and three legs 263, 265 and 267 on the base 266 at a second end 268 opposite to the first end 262. The first inductor core 260 is mounted to the cold plate 170 along the first end 262 such that the base 266 is placed in the slotted recess 175, and the three legs 263, 265 and 267 project outwards from the slotted recess 175. The PCB 240 is disposed over the cold plate 170 and includes the embedded windings 246 of the inductor assembly 200. In some embodiments, the PCB 240 may be mechanically coupled to the cold plate 170 via fasteners (not shown). In the illustrated embodiment, the PCB 240 has a top surface 242, a bottom surface 244 and three apertures 243, 245, 247 through which the three legs 263, 265 and 267 of the first inductor core 260 project outwards. The bottom surface 244 is thermally coupled to the top surfaces 172a, 172b of the cold plate 170.

In some embodiments, a shim layer 250 is disposed between the cold plate 170 and the PCB 240. The shim layer 250 may be formed from a glass-reinforced epoxy laminate (for example, FR-4), a ceramic material or other electrically-insulating material. The shim layer 250 has a top surface 252, a bottom surface 254 and three apertures 253, 255, 257 through which the three legs 263, 265 and 267 of the first inductor core 260 project outwards. The top surface 252 and the bottom surface 254 may be coated with thermal grease to enhance heat transfer between the cold plate 170 and the PCB 240. In other embodiments, the shim layer 250 may not be required.

A spacer 230 is disposed on the three legs 263, 265 and 267 at the second end 268 of the first inductor core 260. The spacer 230 electrically isolates the first inductor core 260 from the second inductor core 220. The spacer 230 may be formed from any of a variety of materials having low electrical conductivity, including, for example, plastics such as polypropylene, polyester, nylon, epoxy and the like, which may be combined with carbon or glass reinforcement. The spacer 230 has a top surface 232 and a bottom surface 234. In some embodiments, both the top surface 232 and the bottom surface 234 are coated with thermal grease to enhance heat transfer between the first inductor core 260 and the second inductor core 220.

In the embodiment shown in FIGS. 2A-2B, the second inductor core 220 is disposed on the spacer 230. The second inductor core 220 has a top surface 222 and a bottom surface 224. The second portion 117 of the heat-spreading bracket 110 is configured to align with the top surface 222 of the second inductor core 220 along the interface 111 such that the heat-spreading bracket 110 can apply a downward clamping force to the second inductor core 220 through the interface 111, without requiring additional fasteners.

In some embodiments, a shim layer 280 is disposed between the second inductor core 220 and the heat-spreading bracket 110. The shim layer 280 may be formed from a glass-reinforced epoxy laminate (for example, FR-4), a ceramic material having a high thermal conductivity (for example, aluminum oxide, $Al_2O_3$) or other electrically-insulating but thermally conducting material. The shim layer 280 has a top surface 282 that is in contact with the second portion 117 of the heat-spreading bracket 110 at the interface 111 and a bottom surface 284 in contact with the top surface 222 of the second inductor core 220. The top surface 282 and the bottom surface 284 may be coated with thermal grease to enhance heat transfer between the second inductor core 220 and the heat-spreading bracket 110. In other embodiments, the shim layer 280 may not be required.

Advantageously, the heat-spreading bracket 110 in the example cooling package 100 provides double-sided cooling of the example inductor assembly 200 instead of single-sided cooling through the cold plate 170 and functions as a more effective heat transfer solution. In operation, heat generated by the first inductor core 260 flows directly to the cold plate 170, while the heat generated by the second inductor core 220 flows first to the second portion 117 of the heat-spreading bracket 110. Due to the high thermal conductivity of the heat-spreading bracket 110, the transferred heat then flows from the second portion 117 to the first portion 113 proximate to the cold plate 170. The heat finally flows from the first portion 113 to the cold plate 170. In this way, the heat-spreading bracket 110 in the cooling package 100 enhances the thermal management of heat generated by the inductor assembly 200 by continually transferring the heat to the cold plate 170, while clamping the second inductor core 220 to the inductor assembly 200.

The heat-spreading bracket 110 has the dual function of mechanical clamping and heat transfer, as described above. In different embodiments, the heat-spreading bracket 110 can be shaped differently depending on characteristics desired with respect to the mean temperature and the mean deflection due to clamping force at the interface 111 between the second inductor core 220 and the heat-spreading bracket 110. The different shapes can be obtained by using a topology optimization method. An example non-limiting topology optimization method is described in E. M. Dede et al., Multiphysics Simulation (Simulation Foundations, Methods and Applications) (2014). The topology optimization method can be performed using non-linear optimization, generally defined by equation (1) below:

$$\text{Minimize } F_0(\gamma), \text{ subject to } G_i(\gamma) \leq 0 \text{ for } i=1, 2, \ldots, m; \text{ and } \gamma_{j\_min} \leq \gamma_j \leq \gamma_{j\_max} \text{ for } j=1,2, \ldots, n \quad \text{Equation (1)}$$

where $F_0(\gamma)$ is an objective function,
$G_i(\gamma)$ is a behavioral constraint, and
$\gamma$ is a design variable associated with material physical parameters having lower and upper bounds as $\gamma_{j\_min}$ and $\gamma_{j\_max}$ respectively.

During the topology optimization method, the objective function $F_0(\gamma)$ is minimized using its sensitivity with respect to the design variable, $\gamma$. The objective function $F_0(\gamma)$ is iteratively evaluated by finite element analysis and sensitivity analysis is performed at each iteration using the sensitivity function. The design variable, $\gamma$ is then updated via an optimization algorithm until a specific convergence criteria is satisfied. In non-limiting embodiments, the optimization algorithm may be the method of moving asymptotes (MMA). In some embodiments, the objective function $F_0(\gamma)$ may consist of separate components to accommodate criteria related to different desirable physical properties, for example including both structural and heat transfer characteristics.

Using the above-described topology optimization method, the heat-spreading bracket 110 may be designed to have different shapes by minimizing an objective function $F_0(\gamma)$ subject to $G_i(\gamma)$, a solid material volume constraint. The optimized heat-spreading bracket 110 may then be manufactured using an additive layer manufacturing process such as, but not limited to, layer-wise selective laser sintering. The computational model of the topology optimization method assumes that there is constant heat generation only from the second inductor core 220, a constant bending stress on the heat-spreading bracket 110 and the material used for fabricating the heat-spreading bracket 110 has uniform thermal conductivity, linear elasticity and other properties that are not temperature-dependent.

In some embodiments, in order to obtain an optimized structural profile, the objective function $F_0(\gamma)$ may be the mean deflection due to clamping force at the interface 111 between the second inductor core 220 and the heat-spreading bracket 110, where the design variable $\gamma$ is related to the Young's modulus of the material (for example, Young's modulus of 69 GPa at 20° C. when aluminum is used to fabricate the heat-spreading bracket 110) and interpolated on a scale from zero to one. Accordingly, the mean deflection due to clamping force at the interface 111 between the second inductor core 220 and the heat-spreading bracket 110 can be optimized and varies depending on the structural and thermal load conditions, material properties and surrounding environment boundary conditions. In some embodiments, the mean deflection may be between about 3.51E-8 mm and about 4.08E-8 mm.

Figure 3A:
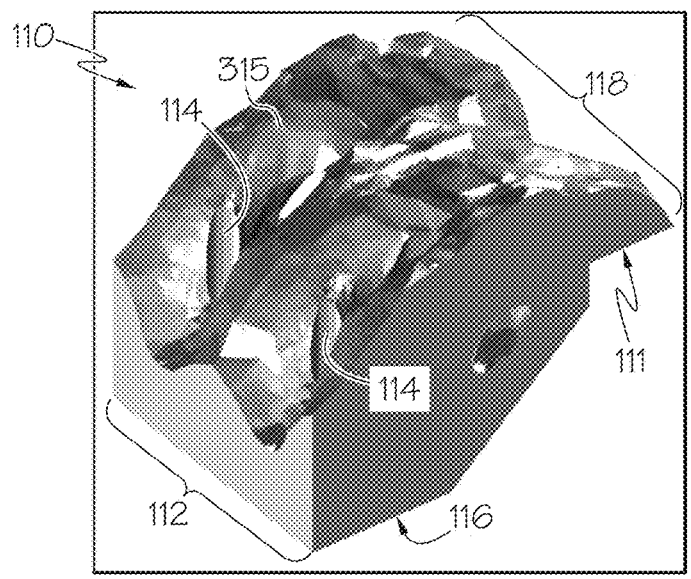
FIG. 3A depicts an isometric view of an example heat-spreading bracket with an optimized structural profile, according to one or more embodiments shown and described herein.
Figure 3B:
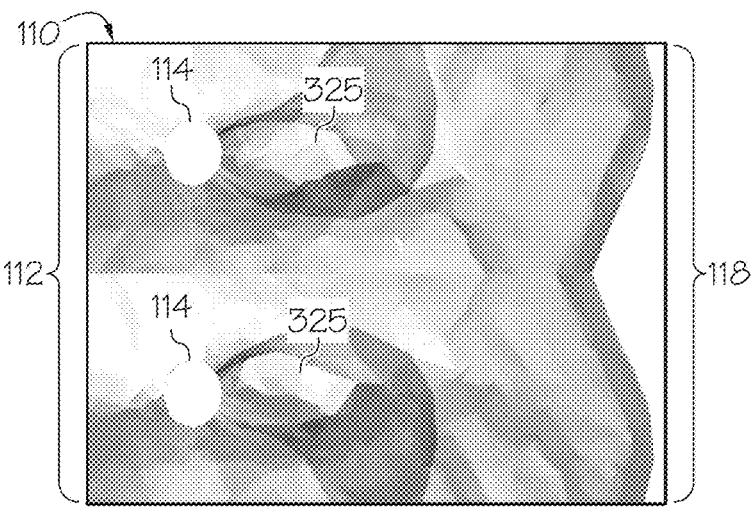
FIG. 3B depicts a top transparent view of the example heat-spreading bracket of FIG. 3A, according to one or more embodiments shown and described herein.
Figure 3C:
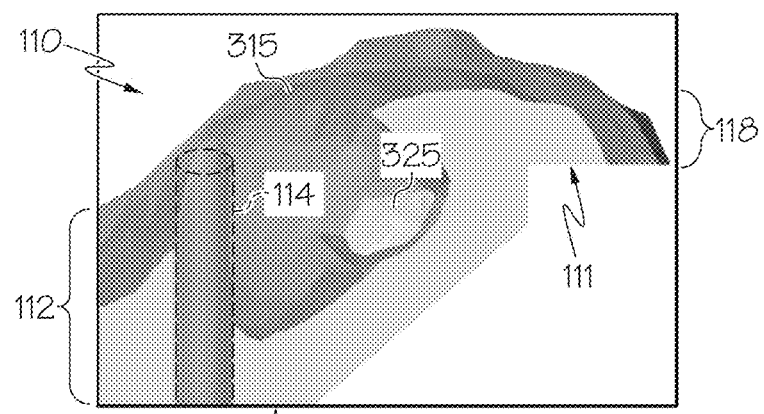
FIG. 3C depicts a side transparent view of the example heat-spreading bracket of FIG. 3A, according to one or more embodiments shown and described herein.

FIG. 3A depicts an isometric view of an example heat-spreading bracket 110 with an optimized structural profile subject to a solid material volume constraint of 50%. In the embodiment shown in FIG. 3A, the mean deflection due to clamping force at the interface 111 between the second inductor core 220 and the heat-spreading bracket 110 is minimized to 3.51E-8 mm, while the mean temperature at the interface 111 between the second inductor core 220 and the heat-spreading bracket 110 is 80° C. FIGS. 3B and 3C show a top transparent view and a side transparent view of the example heat-spreading bracket 110 with an optimized structural profile. In this embodiment as shown in FIGS. 3A-3C, the heat-spreading bracket 110 has a single dome-shaped portion 315 between the first end 112 and the second end 118. This structural design also exhibits internal cavities 325 in the dome-shaped portion 315 as shown in FIGS. 3B-3C imparting truss-like structural characteristics.

Similarly, in some embodiments, in order to obtain an optimized thermal profile, the objective function $F_0(\gamma)$ may be the mean temperature at the interface 111 between the second inductor core 220 and the heat-spreading bracket 110, where the design variable γ is related to the thermal conductivity of the material (for example, thermal conductivity of 237 W/m*K at 20° C. when aluminum is used to fabricate the heat-spreading bracket 110) and interpolated on a scale from zero to one. Accordingly, the mean temperature at the interface 111 between the second inductor core 220 and the heat-spreading bracket 110 can be optimized and varies depending on the structural and thermal load conditions, material properties and surrounding environment boundary conditions. In some embodiments, the mean temperature may be between about 68° C. and about 80° C.

Figure 4A:
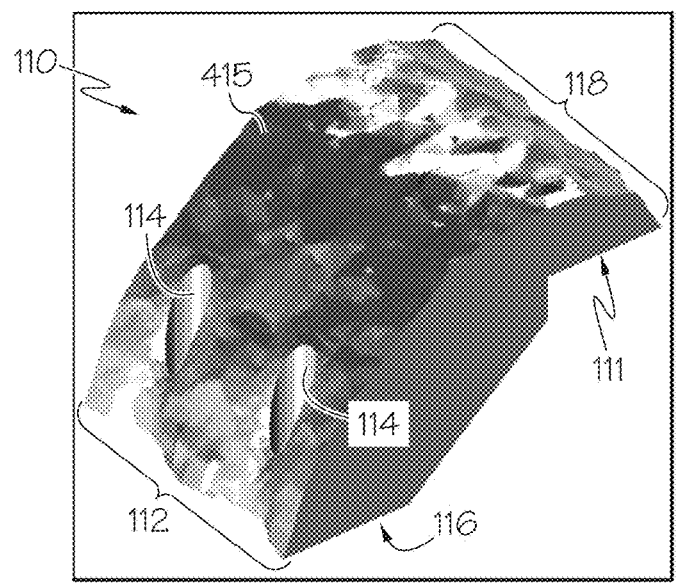
FIG. 4A depicts an isometric view of another example heat-spreading bracket with an optimized thermal profile, according to one or more embodiments shown and described herein.
Figure 4B:
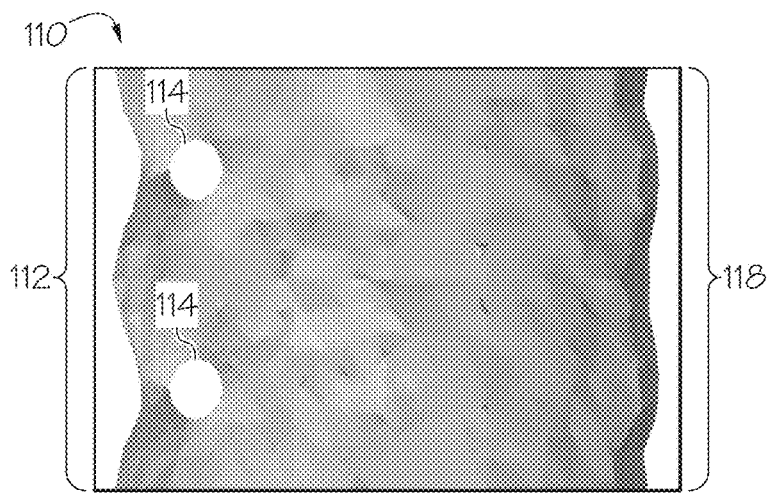
FIG. 4B depicts a top transparent view of the example heat-spreading bracket of FIG. 4A, according to one or more embodiments shown and described herein.
Figure 4C:
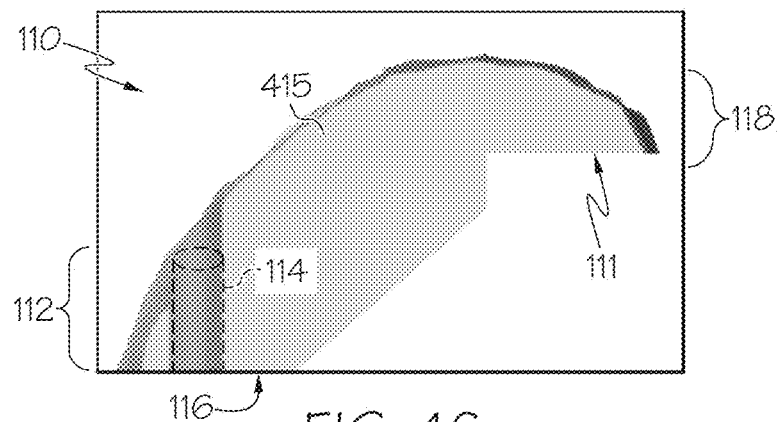
FIG. 4C depicts a side transparent view of the example heat-spreading bracket of FIG. 4A, according to one or more embodiments shown and described herein.

FIG. 4A depicts an isometric view of an example heat-spreading bracket 110 with an optimized thermal profile subject to a solid material volume constraint of 50%. In the embodiment shown in FIG. 4A, the mean temperature at the interface 111 between the second inductor core 220 and the heat-spreading bracket 110 is minimized to 68° C., while the mean deflection due to clamping force at the interface 111 between the second inductor core 220 and the heat-spreading bracket 110 is 4.08E-8 mm. FIGS. 4B and 4C show a top transparent view and a side transparent view of the example heat-spreading bracket 110 with an optimized thermal profile. In this embodiment as shown in FIGS. 4A-4C, the heat-spreading bracket 110 has a single dome-shaped portion 415 between the first end 112 and the second end 118. In this case, the design does not exhibit internal cavities since temperature reduction of the thermal interface with the core is the primary objective. This solid conductor logically has lower thermal resistance than the purely structural design in FIGS. 3A-3C.

In some embodiments, in order to obtain an optimized structural and thermal profiles, the objective function $F_0(\gamma)$ may include separate components directed to the mean temperature and the mean deflection due to clamping force at the interface 111 between the second inductor core 220 and the heat-spreading bracket 110.

Figure 5A:
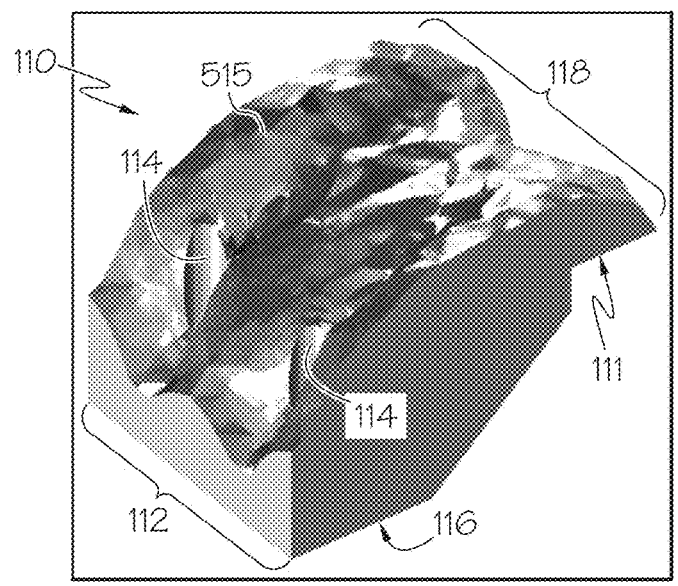
FIG. 5A depicts an isometric view of yet another example heat-spreading bracket with optimized structural and thermal profiles, according to one or more embodiments shown and described herein.
Figure 5B:
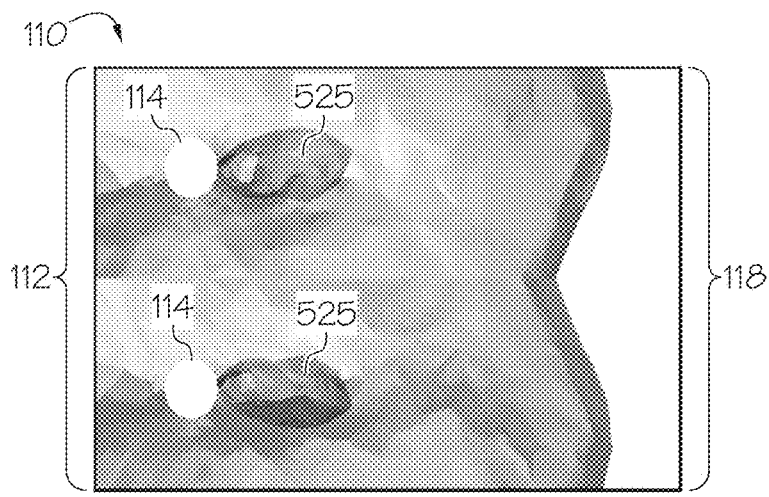
FIG. 5B depicts a top transparent view of the example heat-spreading bracket of FIG. 5A, according to one or more embodiments shown and described herein.
Figure 5C:
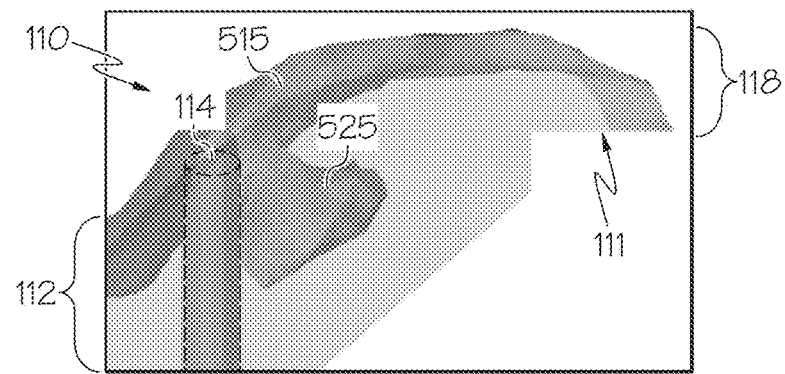
FIG. 5C depicts a side transparent view of the example heat-spreading bracket of FIG. 5A, according to one or more embodiments shown and described herein.

FIG. 5A depicts an isometric view of an example heat-spreading bracket 110 with an optimized structural and thermal profile subject to a solid material volume constraint of 50%. In the embodiment shown in FIG. 5A, the mean deflection due to clamping force at the interface 111 between the second inductor core 220 and the heat-spreading bracket 110 is minimized to 3.62E-8 mm, while the mean temperature at the interface 111 between the second inductor core 220 and the heat-spreading bracket 110 is minimized to 74° C. FIGS. 5B and 5C show a top transparent view and a side transparent view of the example heat-spreading bracket 110 with an optimized structural and thermal profile. In this embodiment as shown in FIGS. 5A-5C, the heat-spreading bracket 110 has a single dome-shaped portion 515 between the first end 112 and the second end 118. Additionally, slightly smaller internal cavities 525 (relative to the design in FIGS. 3A-3C) are observed in the dome-shaped portion 515 in FIGS. 5B-5C. In this embodiment, the mean deflection due to clamping force at the interface 111 between the second inductor core 220 and the heat-spreading bracket 110 represents an intermediate value between the corresponding values when only the structural profile is optimized and only the thermal profile is optimized. Similarly, the mean temperature at the interface 111 between the second inductor core 220 and the heat-spreading bracket 110 represents an intermediate value between the corresponding values when only the structural profile is optimized and only the thermal profile is optimized.

FIG. 6 depicts an isometric view of an example heat-spreading bracket 110 with a heat-spreading structure 600 comprising two heat pipes 600a and 600b embedded within the heat-spreading bracket 110. It should be understood that more or fewer heat pipes may be provided within the heat-spreading structure 600. The heat pipe 600a includes three portions lined with a wicking structure 615a—an evaporator portion 610a, a central adiabatic portion 630a and a condenser portion 620a. Similarly, the heat pipe 600b includes three portions lined with a wicking structure 615b—an evaporator portion 610b, a central adiabatic portion 630b and a condenser portion 620b. In some embodiments, the wicking structures 615a, 615b are made of sintered particles (for example, in the 90-106 μm size range) of a metal or a metal alloy. As non-limiting examples, the metals may be nickel, copper, molybdenum, niobium, aluminum, iron, cobalt, and/or titanium. The wicking structures 615a, 615b are uniformly porous in nature. The wicking structures 615a, 615b are responsible for holding and pumping a working fluid from the condenser portions 620a, 620b to the evaporator portions 610a, 610b by capillary action. These heat pipes and relevant features (i.e. sections and wicks) may be fabricated directly into the bracket using advanced methods (e.g. additive manufacturing), or they may be embedded as inlays into the heat-spreading bracket 110.

The evaporator portions 610a and 610b form an evaporator section 610 of the heat-spreading structure 600 proximate to the second end 118 of the heat-spreading bracket 110. Each of the evaporator portions 610a, 610b of the evaporator section 610 is in thermal contact with and absorbs heat generated by the inductor assembly 200, particularly the second inductor core 220. The condenser portions 620a, 620b form a condenser section 620 of the heat-spreading structure 600 proximate to the first end 112 of the heat-spreading bracket 110. Each of the condenser portions 620a and 620b of the condenser section 620 is in thermal contact with the cold plate 170 and releases the heat absorbed from the inductor assembly 200. The cold plate 170 thus acts as a heat sink device for removing heat from the vapor of the working fluid flowing through the heat-spreading structure 600 in order to transform the vapor into liquid form.

The working fluid circulates along the wicking structures 615a and 615b to transport the heat along the heat-spreading bracket 110 from the second portion 117 to the first portion 113. As a non-limiting example, the working fluid may be water. The thermophysical properties of water, for example, may be ideal for operating temperatures from about 0 degrees Celsius to about 200 degrees Celsius. However, the use of working fluids other than water such as, but not limited to methanol, is also contemplated.

In operation, heat generated by the inductor assembly 200 boils the working fluid in the wicking structures 615a, 615b of the heat pipes 600a, 600b embedded in the heat-spreading bracket 110. Due to boiling, heat from the inductor assembly 200 is absorbed by the working fluid to form a vapor of the working fluid near the evaporator portions 610a, 610b. The vapor flows from the evaporator sections 610a, 610b through the central adiabatic portions 630a, 630b towards the condenser portions 620a, 620b. When the heat is released at the cold plate 170 mechanically coupled to the heat-spreading bracket 110, the vapor transforms into a liquid form of the working fluid and is carried back to the evaporator portions 610a, 610b by the wicking structures 615a, 615b along the central adiabatic portions 630a, 630b by capillary action.

Figure 7:
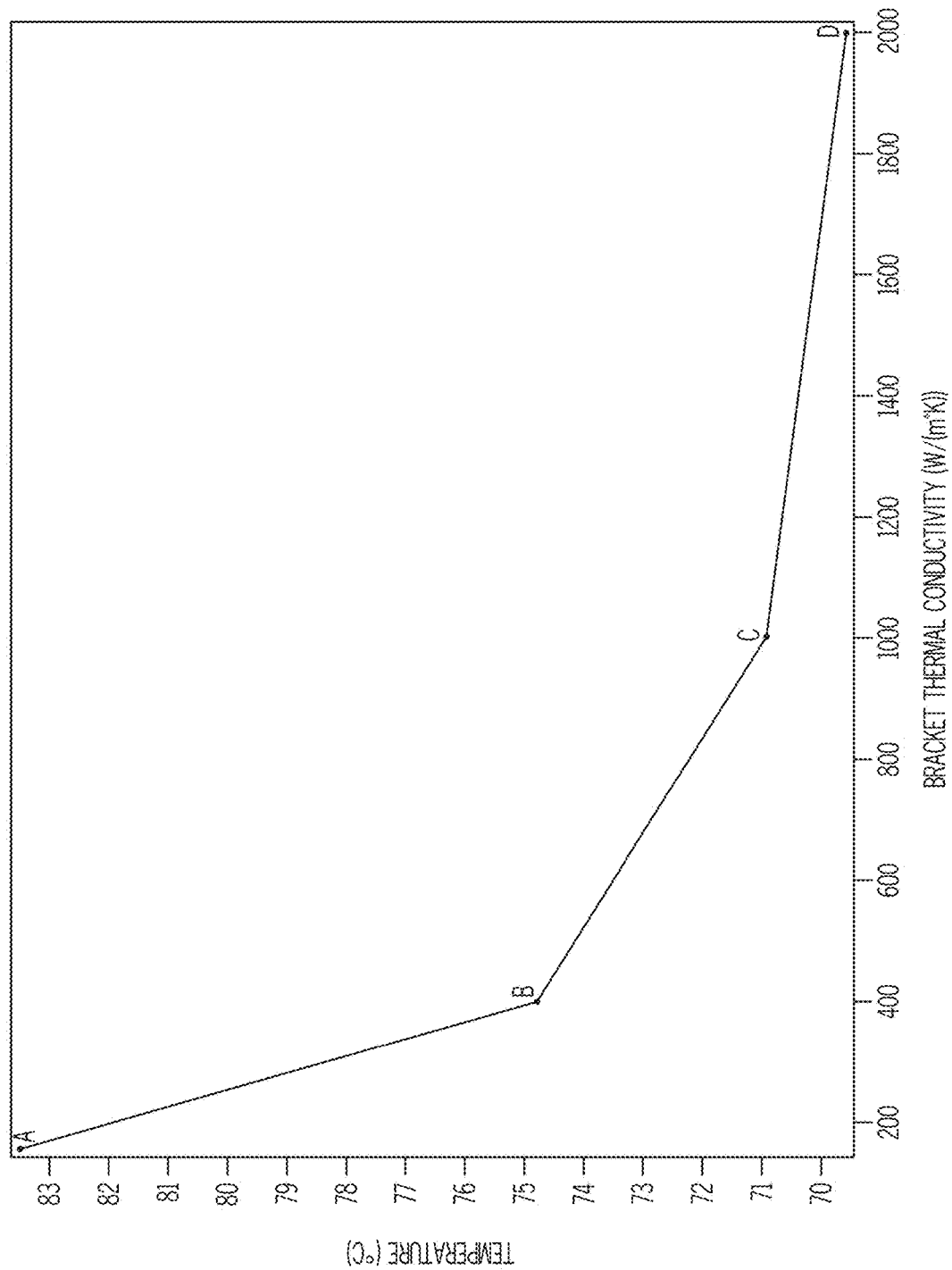
FIG. 7 depicts a graphical plot of thermal conductivity of the material chosen for the heat-spreading bracket against the reduction in temperature of the inductor assembly, according to one or more embodiments shown and described herein.

FIG. 7 depicts a graphical plot of thermal conductivity of the material chosen for the heat-spreading bracket 110 against the temperature of the second inductor core 220 of the inductor assembly 200. FIG. 7 demonstrates the cooling effect on the second inductor core 220 based on the material used to make the heat-spreading bracket 110. The thermal conductivity of the material used to fabricate the heat-spreading bracket 110 is plotted along X-axis and temperature of the second inductor core 220 is plotted along Y-axis. Higher thermal conductivity corresponds to lower temperature and hence more cooling effect on the second inductor core 220. As shown in FIG. 7, the temperature of the second inductor core 220 decreases from when the material used to fabricate the heat-spreading bracket 110 is aluminum (point "A", thermal conductivity of about 200 W/m*K), copper (point "B", thermal conductivity of about 400 W/m*K), aluminum with a graphite inlay (point "C", effective thermal conductivity of about 1000 W/m*K), to when the heat-spreading bracket 110 has embedded heat-pipes 600a, 600b (point "D", effective thermal conductivity of about 2000 W/m*K) as shown in FIG. 6.

The apparatuses described herein can be advantageously used for cooling inductor assemblies used in composite converter systems found in electric vehicles. The heat-spreading bracket described herein provides a double-sided cooling solution for continuously dissipating heat generated by the upper and lower inductor cores that form the planar inductor assembly, while also applying a clamping force to secure the upper inductor core of the inductor assembly. Thus, the temperatures of the upper and lower inductor cores are significantly reduced, resulting in enhanced operational efficiency and improved lifetime of the planar inductor assembly.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling package for an inductor assembly comprising:
   a cold plate having a slotted recess comprising a pair of opposing open sides, the slotted recess configured for mounting a first inductor core along a first end thereof; and
   a heat-spreading bracket mechanically coupled to the cold plate at a first end with at least one mechanical fastener and configured to apply a clamping force to a second inductor core at a second end opposite to the first end of the heat-spreading bracket.

2. The cooling package of claim 1, wherein the slotted recess is shaped as a rectangular notch.

3. The cooling package of claim 1, wherein the heat-spreading bracket comprises a material selected from one of: graphite, a metal, an alloy and a polymer having thermal conductivity greater than 100 W/m*K.

4. The cooling package of claim 1, wherein the heat-spreading bracket comprises an embedded heat pipe having a condenser section proximate to the cold plate and an evaporator section proximate to the second inductor core.

5. The cooling package of claim 1, wherein the heat-spreading bracket has a sloping surface between the first end and the second end such that the second end is positioned at a greater distance with respect to the cold plate than the first end.

6. The cooling package of claim 1, wherein the heat-spreading bracket has a shape designed using a topology optimization method, where a mean temperature at an interface between the second inductor core and the heat-spreading bracket is optimized subject to a solid material volume constraint.

7. The cooling package of claim 1, wherein the heat-spreading bracket has a shape designed using a topology optimization method, where a mean deflection due to clamping force at an interface between the second inductor core and the heat-spreading bracket is optimized subject to a solid material volume constraint.

8. The cooling package of claim 1 further comprising a shim layer between the second inductor core and the heat-spreading bracket, wherein the shim layer comprises a glass-reinforced epoxy laminate or a ceramic material.

9. The cooling package of claim 1, wherein the heat-spreading bracket has a first planar portion proximate to the first end, a second planar portion proximate to the second end and a sloping portion between the first planar portion and the second planar portion.

10. The cooling package of claim 1, wherein the heat-spreading bracket has a dome-shaped portion between the first end and the second end.

11. An inductor assembly comprising:
   a cold plate having a slotted recess comprising a pair of opposing open sides;
   a first inductor core mounted to the cold plate through the slotted recess along a first end of the first inductor core;
   a printed circuit board (PCB) disposed over the first inductor core and having one or more apertures therethrough, wherein a second end of the first inductor core protrudes through the one or more apertures and the second end of the first inductor core is opposite to the first end of the inductor core;
   a second inductor core disposed on the second end of the first inductor core; and
   a heat-spreading bracket mechanically coupled to the cold plate at a first end with at least one mechanical fastener and applying a clamping force to the second inductor core at a second end opposite to the first end of the heat-spreading bracket.

12. The inductor assembly of claim 11, wherein the first inductor core is E-shaped and the second inductor core is I-shaped or E-shaped.

13. The inductor assembly of claim 11, wherein the heat-spreading bracket comprises a material selected from one of: graphite, a metal, an alloy and a polymer having thermal conductivity greater than 100 W/m*K.

14. The inductor assembly of claim 11, wherein the heat-spreading bracket comprises an embedded heat pipe having a condenser section proximate to the cold plate and an evaporator section proximate to the second inductor core.

15. The inductor assembly of claim 11, wherein the heat-spreading bracket has a sloping surface between the first end and the second end such that the second end is positioned at a greater distance with respect to the cold plate than the first end.

16. The inductor assembly of claim 11, wherein the heat-spreading bracket has a shape designed using a topology optimization method, where a mean temperature at an interface between the second inductor core and the heat-spreading bracket is optimized subject to a solid material volume constraint.

17. The inductor assembly of claim 11, wherein the heat-spreading bracket has a shape designed using a topology optimization method, where a mean deflection due to clamping force at an interface between the second inductor core and the heat-spreading bracket is optimized subject to a solid material volume constraint.

18. The inductor assembly of claim 11, wherein the first inductor core and the second inductor core are separated by an electrically-isolating spacer.

19. The inductor assembly of claim 11 further comprising a shim layer between the cold plate and the PCB, wherein the shim layer comprises a glass-reinforced epoxy laminate or a ceramic material.

20. The inductor assembly of claim 11 further comprising a shim layer between the second inductor core and the heat-spreading bracket, wherein the shim layer comprises a glass-reinforced epoxy laminate or a ceramic material.

* * * * *